United States Patent
Tao et al.

(10) Patent No.: US 7,175,949 B1
(45) Date of Patent: Feb. 13, 2007

(54) RADIATION-SENSITIVE COMPOSITIONS AND IMAGEABLE MATERIALS

(75) Inventors: Ting Tao, Fort Collins, CO (US); Paul R. West, Fort Collins, CO (US); Scott A. Beckley, Windsor, CO (US); Nicki R. Miller, Ft. Collins, CO (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 11/356,518

(22) Filed: Feb. 17, 2006

(51) Int. Cl.
G03F 7/032 (2006.01)
G03F 7/033 (2006.01)
G03F 7/031 (2006.01)
G03F 7/30 (2006.01)

(52) U.S. Cl. .................. 430/17; 430/278.1; 430/281.1; 430/302; 430/325; 430/905; 430/910

(58) Field of Classification Search .................. 430/17, 430/281.1, 278.1, 302, 325, 905, 910
See application file for complete search history.

(56) References Cited

U.S. PATENT DOCUMENTS

| | | | |
|---|---|---|---|
| 4,774,163 A | 9/1988 | Higashi | |
| 4,994,347 A * | 2/1991 | Smothers | 430/282.1 |
| 6,309,792 B1 | 10/2001 | Hauck et al. | |
| 6,899,994 B2 | 5/2005 | Huang et al. | |
| 6,908,726 B2 | 6/2005 | Korionoff et al. | |

FOREIGN PATENT DOCUMENTS

JP 2005-187678 7/2005

OTHER PUBLICATIONS

Belfield et al (Eds), *Photoinitiated Polymerization*, Hua and Crivello, "Photosensitization of Onium Salt Initiated Cationic Photopolymerizations by Carbazole Monomers, Polymers, and Oligomers" ACS 2003, pp. 219-231.

* cited by examiner

*Primary Examiner*—Richard L. Schilling
(74) *Attorney, Agent, or Firm*—J. Lanny Tucker

(57) ABSTRACT

A negative-working radiation-sensitive composition includes a polymeric binder comprising a polymer backbone and having attached thereto a carbazole derivative represented by the following Structure (I):

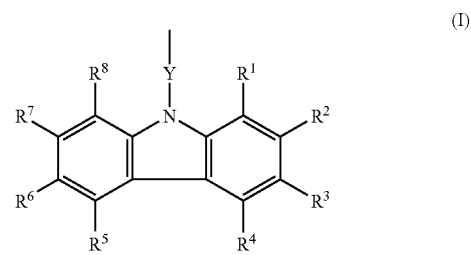

wherein Y is a direct bond or a linking group, and $R^1$ to $R^8$ are independently hydrogen, or an alkyl, alkenyl, aryl, halo, cyano, alkoxy, acyl, acyloxy, or carboxylate groups, or any adjacent $R^1$ through $R^8$ groups can together form a carbocyclic or heterocyclic group or a fused aromatic ring. The composition can be sensitive to radiation having a maximum wavelength of from about 150 to about 1500 nm, and can be used to prepare negative-working imageable elements that be imaged and developed as lithographic printing plates.

25 Claims, 1 Drawing Sheet

RADIATION-SENSITIVE COMPOSITIONS AND IMAGEABLE MATERIALS

FIELD OF THE INVENTION

This invention relates to radiation-sensitive compositions and imageable elements such as negative-working printing plate precursors. More particularly, it relates to highly sensitive radiation-sensitive compositions and imageable elements that can be imaged at a wavelength of from about 150 to about 1500 nm. The invention also relates to methods of using these imageable elements to provide, for example, lithographic printing plates.

BACKGROUND OF THE INVENTION

Radiation-sensitive compositions are routinely used in the preparation of imageable materials including lithographic printing plate precursors. Such compositions generally include a radiation-sensitive component, an initiator system, and a binder, each of which has been the focus of research to provide various improvements in physical properties and thereby imaging performance.

Recent developments in the field of printing plate precursors concern the use of radiation-sensitive compositions that can be imaged by means of lasers or laser diodes, and more particularly, that can be imaged and/or developed on-press. Laser exposure does not require conventional silver halide graphic arts films as intermediate information carriers (or "masks") since the lasers can be controlled directly by computers. High-performance lasers or laser-diodes that are used in commercially-available image-setters generally emit radiation having a wavelength of at least 700 nm, and thus the radiation-sensitive compositions are required to be sensitive in the near-infrared or infrared region of the electromagnetic spectrum. However, other useful radiation-sensitive compositions are designed for imaging with ultraviolet or visible radiation.

There are two possible ways of using radiation-sensitive compositions for the preparation of printing plates. For negative-working printing plates, exposed regions in the radiation-sensitive compositions are hardened and unexposed regions are washed off during development. For positive-working printing plates, the exposed regions are dissolved in a developer and the unexposed regions become an image.

Negative-working radiation-sensitive compositions and imageable elements are described for example, in U.S. Pat. No. 6,309,792 (Hauck et al.), U.S. Pat. No. 6,569,603 (Furukawa et al.), and U.S. Pat. No. 6,899,994 (Huang et al.), and EP 1,182,033 (Fujimako et al.) and EP 1,449,650 (Goto).

Problem to be Solved

U.S. Pat. No. 4,774,163 (Higashi) describes photopolymerizable compositions containing a carbazole derivative and optionally a linear polymer binder for photoresists and printing plate preparation.

While many known negative-working radiation sensitive compositions have found usefulness in the industry, there continues to be a need to improve photosensitivity. In addition, known negative-working imageable elements often require a pre-heat step after imagewise exposure and before development in order to enhance the crosslinking within the imageable layer.

There is a desire in the industry to reduce processing steps where possible including the conventional pre-heat step.

There is also a need to have compositions of this type that can be imaged using a variety of imaging devices at various wavelengths from 150 to 1500 nm.

SUMMARY OF THE INVENTION

The present invention provides a radiation-sensitive composition comprising:
a radically polymerizable component,
an initiator composition capable of generating radicals sufficient to initiate polymerization of the radically polymerizable component upon exposure to imaging radiation,
a sensitizing dye, and
a polymeric binder comprising a polymer backbone and having attached thereto a carbazole derivative represented by the following Structure (I):

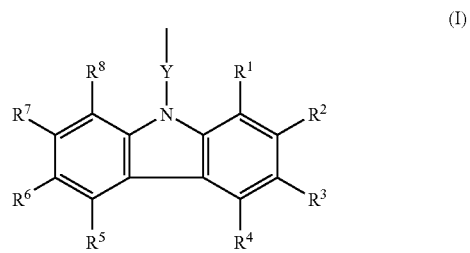

(I)

wherein Y is a direct bond or a linking group, and $R^1$ to $R^8$ are independently hydrogen, or an alkyl, alkenyl, aryl, halo, cyano, alkoxy, acyl, acyloxy, or carboxylate group, or any adjacent $R^1$ through $R^8$ groups can together form a carbocyclic or heterocyclic group or a fused aromatic ring.

This invention also provides a negative-working imageable element comprising a substrate having thereon an imageable layer comprising the radiation-sensitive composition described above.

This invention also provides a method of making a negative-working printing plate comprising:
A) imagewise exposing an imageable element of this invention (for example, as described above),
to form both imaged and non-imaged regions in the imageable layer,
B) developing the imagewise exposed imageable layer to remove only the non-imaged regions, and
C) optionally baking the imagewise exposed element after step A.

Also provided by this invention are imaged elements that are obtained from the method described above.

The present invention provides a number of advantages. The negative-working radiation-sensitive compositions and imageable elements can be designed to be sensitive and imageable at any wavelength of from about 150 to about 1500 nm by choosing appropriate sensitizing dyes. Thus, imaging can be carried out using ultraviolet (UV) or visible radiation, and alternatively using infrared radiation (IR). In addition, a pre-heat step is not needed and improved sensitivity (digital speed) and durability to imaging radiation is achieved by using a particular binder containing pendant carbazole groups represented by Structure I.

DETAILED DESCRIPTION OF THE INVENTION

Definitions

Figure 1:
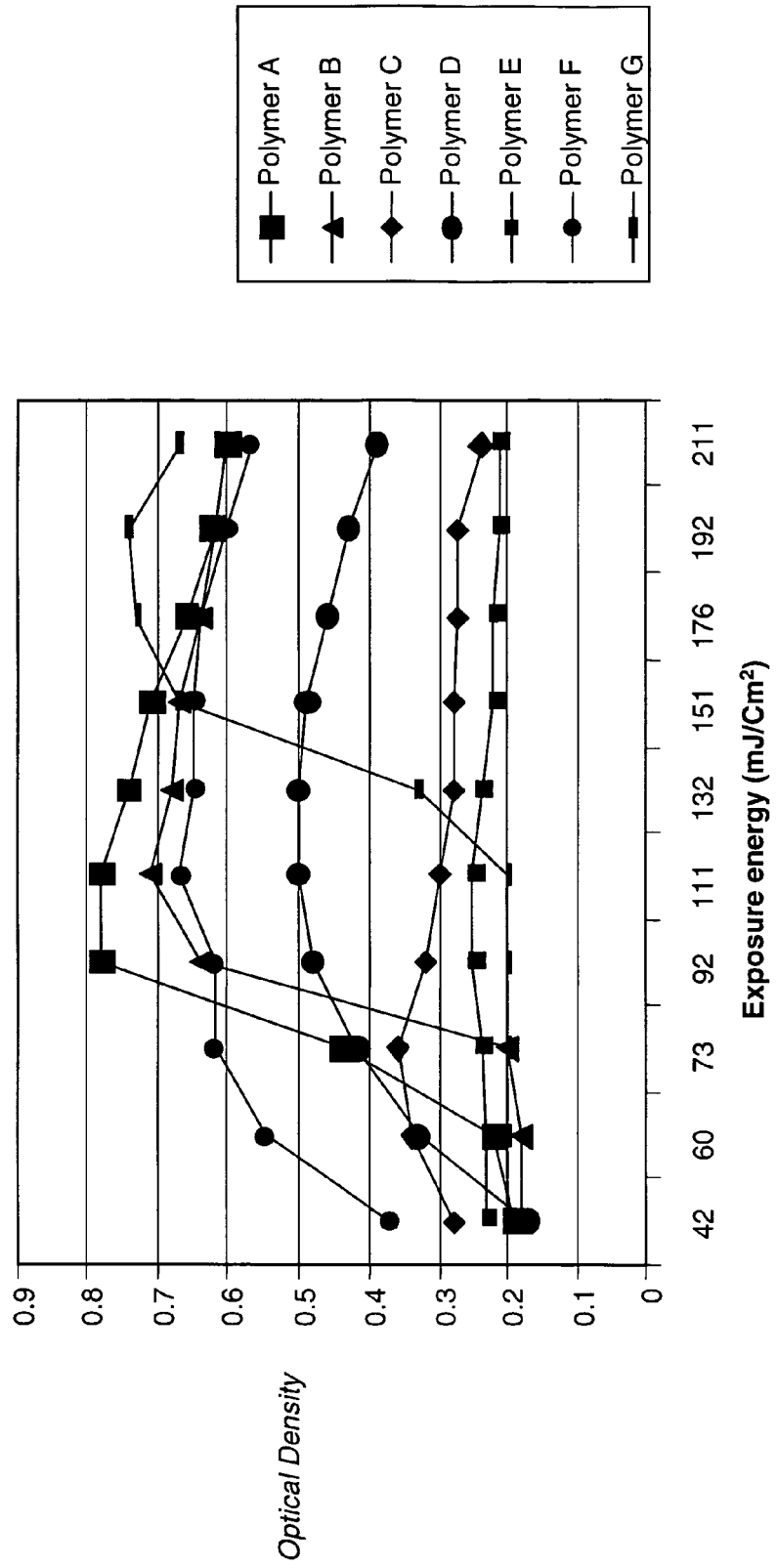
FIG. 1 is a graphical representation of Optical Density vs. Exposure Energy (mJ/cm$^2$) data as described in Examples 1–4 below.

As used herein, "acid number" is the number of milligrams of KOH required to neutralize the free acid groups in one gram of the substance (for example, a radically polymerizable component or polymeric binder, as described below).

Unless the context indicates otherwise, when used herein, the term "radiation-sensitive composition", "imageable element", and "printing plate precursor" are meant to be references to embodiments of the present invention.

In addition, unless the context indicates otherwise, the various components described herein such as "polymeric binders", "sensitizing dyes", "radically polymerizable component", "polymeric binder", and similar terms also refer to mixtures of such components. Thus, the use of the article "a" is not necessarily meant to refer to only a single component.

Moreover, unless otherwise indicated, percentages refer to percents by dry weight.

For clarification of definitions for any terms relating to polymers, reference should be made to "Glossary of Basic Terms in Polymer Science" as published by the International Union of Pure and Applied Chemistry ("IUPAC"), *Pure Appl. Chem.* 68, 2287–2311 (1996). However, any definitions explicitly set forth herein should be regarded as controlling.

The term "polymer" refers to high and low molecular weight polymers including oligomers and includes homopolymers and copolymers.

The term "copolymer" refers to polymers that are derived from two or more different monomers.

The term "backbone" refers to the chain of atoms in a polymer to which a plurality of pendant groups are attached. An example of such a backbone is an "all carbon" backbone obtained from the polymerization of one or more ethylenically unsaturated polymerizable monomers. However, other backbones can include heteroatoms wherein the polymer is formed by a condensation reaction or some other means.

Radiation-Sensitive Compositions

One aspect of the present invention is a radiation-sensitive composition that may have any utility wherever there is a need for a coating that is polymerizable using suitable electromagnetic radiation, and particularly where it is desired to remove unexposed regions of the coated and imaged composition. The radiation-sensitive compositions can be used in photomask lithography, photoresists, imprint lithography, microelectronic and microoptical devices, printed circuit boards, paints, and molding compositions. Preferably, they are used to prepare negative-working lithographic printing plate precursors and imaged lithographic printing plates that are defined in more detail below.

The radically polymerizable component present in the radiation-sensitive composition contains any polymerizable group that can be polymerized using free radical initiation. For example, the radically polymerizable component can contain an addition polymerizable ethylenically unsaturated group, a crosslinkable ethylenically unsaturated group, a ring-opening polymerizable group, an azido group, an aryldiazonium salt group, an aryldiazosulfonate group, or a combination thereof.

Suitable ethylenically unsaturated compounds that can be polymerized or crosslinked include ethylenically unsaturated polymerizable monomers that have one or more of the polymerizable groups, including unsaturated esters of alcohols, such as acrylate and methacrylate esters of polyols. Oligomers and/or prepolymers, such as urethane acrylates and methacrylates, epoxide acrylates and methacrylates, polyester acrylates and methacrylates, polyether acrylates and methacrylates, and unsaturated polyester resins can also be used.

Particularly useful radically polymerizable components comprise addition polymerizable ethylenically unsaturated groups having multiple acrylate and methacrylate groups and combinations thereof such as polyfunctional acrylate and methacrylate monomers. Examples of such compounds include, but are not limited to, 1,4-butanediol diacrylate, 1,6-hexanediol, neopentylglycol diacrylate, tetraethyleneglycol diacrylate, trisacryloyloxyethyl isocyanurate, tripropyleneglycol diacrylate, ethyleneglycol glycerol triacrylate, glycerol epoxy triacrylate, trimethylolpropane triacrylate, pentaerythritol triacrylate, pentaerythritol tetraacrylate, and corresponding methacrylates.

Alternatively, oligomers having radical polymerizable groups can be used, such as polyester acrylates, urethane acrylates, epoxy acrylates, and corresponding methacrylates each of which may include an acryloyl group or methacryloyl group.

More particularly useful radically polymerizable compounds include those derived from urea urethane (meth)acrylates or urethane (meth)acrylates having multiple polymerizable groups. For example, a most preferred radically polymerizable component can be prepared by reacting DESMODUR® N100 aliphatic polyisocyanate resin based on hexamethylene diisocyanate (Bayer Corp., Milford Conn.) with hydroxyethyl acrylate and pentaerythritol triacrylate. Other preferred radically polymerizable compounds are available from Sartomer Company, Inc. such as SR399 (dipentaerythritol pentaacrylate), SR355 (di-trimethylolpropane tetraacrylate), SR295 (pentaerythritol tetraacrylate), and others that would be readily apparent to one skilled in the art.

Numerous other radically polymerizable compounds are known to those skilled in the art and are described in considerable literature including *Photoreactive Polymers: The Science and Technology of Resists*, A Reiser, Wiley, New York, 1989, pp. 102–177, by B. M. Monroe in *Radiation Curing: Science and Technology*, S. P. Pappas, Ed., Plenum, New York, 1992, pp. 399–440, and in "Polymer Imaging" by A. B. Cohen and P. Walker, in *Imaging Processes and Material*, J. M. Sturge et al. Eds., Van Nostrand Reinhold, New York, 1989, pp. 226–262. Useful radically polymerizable components are also described in EP 1,182,033A1 (noted above), beginning with paragraph [0170], all of which is incorporated herein by reference.

In some embodiments, the radically polymerizable component comprises carboxy groups in an amount sufficient to provide an acid number greater than 0 mg KOH per grams of polymerizable component, and generally from 0 to about 200 mg KOH per gram of the polymerizable component. Preferably, the acid number is from 0 to about 100 mg KOH/gram of polymerizable component and more preferably, it is from 0 to about 60 mg KOH/gram of polymerizable component.

Radically polymerizable compounds containing carboxy groups can be prepared in a number of ways. For example, oligomers containing carboxy groups can be prepared as described for in the teaching of Col. 4 (line 42) to Col. 5 (line 19) and Col. 7 (line 14) to Col. 8 (line 45) of U.S. Pat. No. 4,228,232 (Rousseau) that is incorporated herein by reference. The carboxy groups can be added to the oligomers preferably after addition of the free radical polymerizable moieties by reaction of remaining hydroxy groups on the oligomer backbone with a compound having free carboxy groups (such as a dicarboxylic acid or anhydride). The resulting oligomers can be polymerized to provide a desired carboxy-substituted polymer.

Alternatively, a poly(urea urethane)acrylate or poly(urethane)acrylate can be prepared from the reaction of a diisocyanate with a diol having free carboxy groups similarly to the preparation of allyl functional polyurethanes described in U.S. Pat. No. 5,919,600 (Huang et al.) that is incorporated by reference.

The radically polymerizable component is present in the radiation-sensitive composition in an amount generally sufficient to render the composition insoluble in an aqueous developer after exposure to radiation. For example, the weight ratio of radically polymerizable component to polymeric binder is generally from about 5:95 to about 95:5, preferably from about 10:90 to about 90:10, and more preferably from about 30:70 to about 70:30. The radically polymerizable component can be present in an amount of from about 10 to about 70%, preferably from about 20 to about 50%, based on the totals solids in the radiation sensitive composition, or the total dry weight of the imageable layer.

The radiation-sensitive composition also includes an initiator composition that generates radicals sufficient to initiate the polymerization reaction of the radically polymerizable component(s) upon imagewise exposure of the composition. The initiator composition may be useful, for example, in imaging compositions sensitive to electromagnetic radiation in the ultraviolet, visible and/or infrared spectral regions, corresponding to the spectral range of from about 150 to about 1500 nm. Some initiator compositions can be used at any exposure wavelength while others are most useful upon exposure within certain regions of the electromagnetic spectrum.

In general, suitable initiator compositions comprise compounds that include but are not limited to, amines (such as alkanol amines), thiol compounds, anilinodiacetic acids or derivatives thereof, N-phenyl glycine and derivatives thereof, N,N-dialkylaminobenzoic acid esters, N-arylglycines and derivatives thereof (such as N-phenylglycine), aromatic sulfonylhalides, trihalogenomethylsulfones, imides (such as N-benzoyloxyphthalimide), diazosulfonates, 9,10-dihydroanthracene derivatives, N-aryl, S-aryl, or O-aryl polycarboxylic acids with at least 2 carboxy groups of which at least one is bonded to the nitrogen, oxygen, or sulfur atom of the aryl moiety (such as aniline diacetic acid and derivatives thereof and other "co-initiators" described in U.S. Pat. No. 5,629,354 of West et al.), 1,3,5-triazine derivatives with 1 to 3 —$CX_3$ groups wherein X independently represent chlorine or bromine atoms [such as 2-phenyl-4,6-bis(trichloromethyl)-s-triazine, 2,4,6-tris(trichloromethyl)-s-triazine, 2-methyl-4,6-bis(trichloromethyl)-s-triazine, 2-(styryl-4,6-bis(trichloromethyl)-s-triazine, 2-(p-methoxystyryl)-4,6-bis(trichloromethyl)-s-triazine, 2-(4-methoxynaphtho-1-yl)-4,6-bis(trichloromethyl)-s-triazine, 2-(4-ethoxynaphtho-1-yl)-4,6-bis(trichloromethyl)-s-triazine, and 2-(4-(2-ethoxyethyl)-naphtho-1-yl)-4,6-bis(trichloromethyl)-s-triazine], oxime ethers and oxime esters (such as those derived from benzoin), α-hydroxy or α-amino-acetophenones, alkyltriarylborates, trihalogenomethylarylsulfones, benzoin ethers and esters, peroxides (such as benzoyl peroxide), hydroperoxides (such as cumyl hydroperoxide), azo compounds (such as azo bis-isobutyronitrile), 2,4,5-triarylimidazolyl dimers (also known as hexaarylbisimidazoles, or "HABI's") as described for example in U.S. Pat. No. 4,565,769 (Dueber et al.), trihalomethyl triazines in combination with a photosensitizer as described in U.S. Pat. No. 4,997,745 (Kawamura et al.), 3-ketocoumarins for UV and visible light activation, borate and organoborate salts such as those described in U.S. Pat. No. 6,562,543 (Ogata et al.), and onium salts (such as ammonium salts, diaryliodonium salts, triarylsulfonium salts, aryldiazonium salts, and N-alkoxypyridinium salts). Other known initiator composition components are described for example in U.S Patent Application Publication 2003/0064318 (noted above), incorporated herein by reference. Particularly useful initiator composition components for UV and visible light sensitive radiation-sensitive compositions include hexaarylbisimidazoles such as, for example, 2,2-bis(2-chlorophenyl)-4,4',5,5'-tetraphenyl-biimidazole. The triazines noted above can be used with exposure at about any wavelength including UV and visible radiation exposure.

For IR-sensitive radiation-sensitive compositions, the preferred initiator compositions comprise an onium salt including but not limited to, a sulfonium, oxysulfoxonium, oxysulfonium, sulfoxonium, ammonium, selenonium, arsonium, phosphonium, diazonium, or halonium salt. Further details of useful onium salts, including representative examples, are provided in U.S. Patent Application Publication 2002/0068241 (Oohashi et al.), WO 2004/101280 (Munnelly et al.), and U.S. Pat. No. 5,086,086 (Brown-Wensley et al.), U.S. Pat. No. 5,965,319 (Kobayashi), and U.S. Pat. No. 6,051,366 (Baumann et al.), that are all incorporated herein by reference. For example, suitable phosphonium salts include positive-charged hypervalent phosphorus atoms with four organic substituents. Suitable sulfonium salts such as triphenylsulfonium salts include a positively-charged hypervalent sulfur with three organic substituents. Suitable diazonium salts possess a positive-charged azo group (that is —N=$N^+$). Suitable ammonium salts include a positively-charged nitrogen atom such as substituted quaternary ammonium salts with four organic substituents, and quaternary nitrogen heterocyclic rings such as N-alkoxypyridinium salts. Suitable halonium salts include a positively-charged hypervalent halogen atom with two organic substituents. The onium salts generally include a suitable number of negatively-charged counterions such as halides, hexafluorophosphate, thiosulfate, hexafluoroantimonate, tetrafluoroborate, sulfonates, hydroxide, perchlorate, n-butyltriphenyl borate, tetraphenyl borate, and others readily apparent to one skilled in the art.

The halonium salts are more preferred, and the iodonium salts are most preferred. In one preferred embodiment, the onium salt has a positively-charged iodonium, (4-methylphenyl)[4-(2-methylpropyl)phenyl]-moiety and a suitable negatively charged counterion. A representative example of such an iodonium salt is available as Irgacure® 250 from Ciba Specialty Chemicals (Tarrytown, N.Y.) that is (4-methylphenyl)[4-(2-methylpropyl)phenyl]iodonium hexafluorophosphate and is supplied in a 75% propylene carbonate solution.

The free radical generating compounds in the initiator composition are generally present in the radiation-sensitive composition in an amount of at from about 0.5% to about 30%, and preferably from about 1 to about 15%, based on composition total solids or total dry weight of the imageable layer. The optimum amount of the various sensitizers may differ for various compounds and the sensitivity of the radiation-sensitive composition that is desired and would be readily apparent to one skilled in the art.

The radiation-sensitive composition includes one or more sensitizers that sensitize the composition to radiation having a $\lambda_{max}$ of from the UV to the IR region of the electromagnetic spectrum, that is, from 150 to 1500 nm. Some sensitizers can be used at any wavelength, but most sensitizers are optimally useful within certain wavelength ranges. For example, some sensitizers are optimal for use at an exposure wavelength of from about 150 to 650 nm (UV to visible) while others are optimal for use at an exposure wavelength of from about 650 to about 1500 nm (near IR and IR).

In some preferred embodiments, the radiation-sensitive composition contains a UV sensitizer where the free-radical generating compound is UV radiation sensitive (that is from about 150 to about 450 nm), thereby facilitating photopolymerization. Typical UV radiation-sensitive free-radical generating compounds include ketocoumarins (particularly in combination with a polycarboxylic acid free radical generating compound, such as anilino-N,N-diacetic acid as a secondary co-initiator), trichloromethyl triazines as described, for example, in U.S. Pat. No. 4,997,745 (Kawamura et al.) and diaryliodonium salts. Secondary co-initiators can be used, such as titanocenes, polycarboxylic acids, haloalkyl triazines, hexaaryl bisimidizoles, borate salts, and photooxidants containing a heterocyclic nitrogen that is substituted by an alkoxy or acyloxy group, as described in U.S. Pat. No. 5,942,372 (West et al.).

Sensitizers that absorb in the visible region of the electromagnetic spectrum (that is from about 400 to about 650 nm) can also be used. Examples of such sensitizers are well known in the art and include the compounds described in Cols. 17–22 of U.S. Pat. No. 6,569,603 (noted above) that is incorporated herein by reference.

Other useful visible and UV-sensitive sensitizing compositions include a cyanine dye, diaryliodonium salt, and a co-initiator (as described above) as described in U.S. Pat. No. 5,368,990 (Kawabata et al.).

In more preferred embodiments, the radiation sensitive compositions are sensitized to "violet" radiation in the range of from about 375 to about 450 nm. Useful sensitizers for such compositions include certain pyrilium and thiopyrilium dyes.

Other useful sensitizers for the violet/visible region of sensitization are the 2,4,5-triaryloxazole derivatives as described in WO 2004/074930 (Baumann et al.) that is incorporated herein by reference. These compounds can be used alone or with a co-initiator as described above, and especially with the 1,3,5-triazines described above. Useful 2,4,5-triaryloxazole derivatives can be represented by the Structure G-$(Ar_1)_3$ wherein $Ar_1$ is the same or different, substituted or unsubstituted carbocyclic aryl group having 6 to 12 carbon atoms in the ring, and G is a furan, oxazole, or oxadiazole ring. The $Ar_1$ groups can be substituted with one or more halo, substituted or unsubstituted alkyl, substituted or unsubstituted cycloalkyl, substituted or unsubstituted aryl, amino (primary, secondary, or tertiary), or substituted or unsubstituted alkoxy or aryloxy groups. Thus, the aryl groups can be substituted with one or more $R'_1$ through $R'_3$ groups, respectively, that are independently hydrogen or a substituted or unsubstituted alkyl group having from 1 to 20 carbon atoms (such as methyl, ethyl, iso-propyl, n-hexyl, benzyl, and methoxymethyl groups) substituted or unsubstituted carbocyclic aryl group having 6 to 10 carbon atoms in the ring (such as phenyl, naphthyl, 4-methoxyphenyl, and 3-methylphenyl groups), substituted or unsubstituted cycloalkyl group having 5 to 10 carbon atoms in the ring, a —N($R'_4$)($R'_5$) group, or a —O$R'_6$ group wherein $R'_4$ through $R'_6$ independently represent substituted or unsubstituted alkyl or aryl groups as defined above. Preferably, at least one of $R'_1$ through $R'_3$ is an —N($R'_4$)($R'_5$) group wherein $R'_4$ and $R'_5$ are the same or different alkyl groups. Preferred substituents for each $Ar_1$ group include the same or different primary, secondary, and tertiary amines and more preferably they are the same dialkylamines.

Still another class of useful violet/visible radiation sensitizers include compounds represented by the Structure $Ar_1$-G-$Ar_2$ wherein $Ar_1$ and $Ar_2$ are the same or different substituted or unsubstituted aryl groups having 6 to 12 carbon atoms in the ring, or $Ar_2$ can be an arylene-G-$Ar_1$ or arylene-G-$Ar_2$ group, and G is a furan, ozazole, or oxadiazole ring. $Ar_1$ is the same as defined above, and $Ar_2$ can be the same or different aryl group as $Ar_1$. "Arylene" can be any of the aryl groups defined for $Ar_1$ but with a hydrogen atom removed to render them divalent in nature.

Additional useful violet-visible radiation sensitizers are the compounds described in WO 2004/074929 (Baumann et al.) that is also incorporated herein by reference. These compounds comprise the same or different aromatic heterocyclic groups connected with a spacer moiety that comprises at least one carbon—carbon double bond that is conjugated to the aromatic heterocyclic groups, and are represented in more detail by Formula (I) of the noted publication.

In embodiments of the invention that are sensitive to infrared radiation, the radiation-sensitive compositions can further comprise an infrared radiation absorbing compound ("IR absorbing compounds") that absorbs radiation from about 700 to about 1500 nm and preferably from about 750 to about 1200 nm. It is particularly useful for such IR absorbing compounds to be used in combination with onium salts to enhance polymerization of the polymerizable component and to produce a more durable printing plate.

Examples of suitable IR dyes include but are not limited to, azo dyes, squarilium dyes, croconate dyes, triarylamine dyes, thioazolium dyes, indolium dyes, oxonol dyes, oxaxolium dyes, cyanine dyes, merocyanine dyes, phthalocyanine dyes, indocyanine dyes, indotricarbocyanine dyes, oxatricarbocyanine dyes, thiocyanine dyes, thiatricarbocyanine dyes, merocyanine dyes, cryptocyanine dyes, naphthalocyanine dyes, polyaniline dyes, polypyrrole dyes, polythiophene dyes, chalcogenopyryloarylidene and bi(chalcogenopyrylo) polymethine dyes, oxyindolizine dyes, pyrylium dyes, pyrazoline azo dyes, oxazine dyes, naphthoquinone dyes, anthraquinone dyes, quinoneimine dyes, methine dyes, arylmethine dyes, squarine dyes, oxazole dyes, croconine dyes, porphyrin dyes, and any substituted or ionic form of the preceding dye classes. Suitable dyes are also described in U.S. Pat. No. 6,569,603 (noted above, see Cols. 22–28) and U.S. Pat. No. 5,208,135 (Patel et al.) that are incorporated herein by reference.

Cyanine dyes having an anionic chromophore are also useful in the present invention. For example, the cyanine dye may have a chromophore having two heterocyclic groups. In another embodiment, the cyanine dye may have at least two sulfonic acid groups, more particularly two sulfonic acid groups and two indolenine groups. Useful IR-sensitive cyanine dyes of this type are especially useful for on-press developable radiation-sensitive compositions and imageable elements as described for example in U.S Patent Application Publication 2005-0130059 (Tao).

Cyanine dyes may also be useful in combination with a trihalomethyl triazine and an organoboron salt as described for example in U.S. Pat. No. 5,496,903 (Watanabe et al.).

A general description of one class of suitable cyanine dyes is shown by the formula in paragraph 0026 of WO 2004/101280, incorporated herein by reference, and two specific examples of useful IR absorbing compounds are identified below with the Examples as IR Absorbing Dyes I and II.

In addition to low molecular weight IR-absorbing dyes, IR dye moieties bonded to polymers can be used as well. Moreover, IR dye cations can be used as well, that is, the cation is the IR absorbing portion of the dye salt that ionically interacts with a polymer comprising carboxy, sulfo, phospho, or phosphono groups in the side chains.

Near infrared absorbing cyanine dyes are also useful and are described for example in U.S. Pat. No. 6,309,792 (Hauck et al.), U.S. Pat. No. 6,264,920 (Achilefu et al.), U.S. Pat. No. 6,153,356 (Urano et al.), U.S. Pat. No. 5,496,903 (Watanate et al.). Suitable dyes may be formed using conventional methods and starting materials or obtained from various commercial sources including American Dye Source (Baie D'Urfe, Quebec, Canada) and FEW Chemicals (Germany). Other useful dyes for near infrared diode laser beams are described, for example, in U.S. Pat. No. 4,973,572 (DeBoer).

Useful IR absorbing compounds include carbon blacks including carbon blacks that are surface-functionalized with solubilizing groups are well known in the art. Carbon blacks that are grafted to hydrophilic, nonionic polymers, such as FX-GE-003 (manufactured by Nippon Shokubai), or which are surface-functionalized with anionic groups, such as CAB-O-JET® 200 or CAB-O-JET® 300 (manufactured by the Cabot Corporation) are also useful.

The amount of sensitizer in the radiation-sensitive composition can vary depending upon the type of compound, exposure wavelength, and free-radical generating compounds used. Generally, the amount of sensitizer is from about 1 to about 20% based on the total composition solid weight or the dry weight coverage of the imageable element layer in which it is located. For the UV and visible sensitizers, the preferred amount may be from about 1 to about 20%, and for the IR and near-IR sensitizers, the coverage may be from about 1 to about 20%, both based on total composition solid weight or dry layer weight.

The polymeric binders useful in the present invention comprise a polymer backbone and have attached thereto a carbazole derivative represented by the following Structure (I):

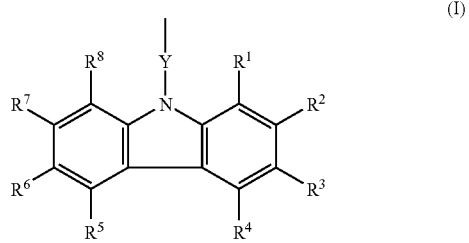

wherein Y is a direct bond or a divalent linking group. Such linking groups can include, but are not limited to, substituted or unsubstituted alkylene groups having 1 to 4 carbon atoms, substituted or unsubstituted phenylene groups, oxy, thio, —NR'— (wherein R' is hydrogen or an alkyl group), —C(O)—, —C(O)O—, —S(O)$_2$—, or combinations of two or more of such groups.

$R^1$ to $R^8$ are independently hydrogen, or a substituted or unsubstituted alkyl group having 1 to 8 carbon atoms (such as methyl, ethyl, iso-propyl, n-pentyl, benzyl, and iso-octyl groups), substituted or unsubstituted alkenyl groups having 2 to 4 carbon atoms (such as ethenyl, allyl, or propenyl groups), substituted or unsubstituted aryl groups having 6 to 10 carbon atoms in the aromatic ring (such as phenyl, 4-methylphenyl, and naphthyl), halo groups (such as chloro or bromo), cyano, substituted or unsubstituted alkoxy groups having 1 to 8 carbon atoms (such as methoxy, ethoxy, 2-propoxy, and n-octyloxy), substituted or unsubstituted acyl or acyloxy groups, or a carboxylate group. Alternatively, any adjacent $R^1$ through $R^8$ groups can together form a substituted or unsubstituted carbocyclic or heterocyclic group or a fused aromatic ring.

Preferably, Y is direct bond, and $R^1$ to $R^8$ are independently hydrogen, or alkyl groups having 1 to 8 carbon atoms or halo groups. More preferably, each of $R^1$ to $R^8$ is hydrogen.

The polymeric binder generally has an acid value of from about 5 to about 400 mg KOH/g (preferably from about 10 to about 200, and more preferably from about 30 to about 150, mg KOH/g), and can also be represented by the following Structure (II):

wherein A represents recurring units comprising the carbazole derivative represented by Structure (I), B represents recurring units derived from ethylenically unsaturated polymerizable monomers that do not comprise a carbazole derivative, x is from about 0.1 to about 99.9 mol % (preferably from about 5 to about 50 mol %), and y is from about 0.1 to about 99.9 mol % (preferably from about 50 to about 95 mol %), based on total recurring units.

In Structure (II), B represents recurring units derived from one or more ethylenically unsaturated polymerizable monomers that do not have a pendant carbazole group (or derivative thereof). A variety of monomers can be used for providing B recurring units, including styrenic monomers, (meth)acrylamide, (meth)acrylates, (meth)acrylic acids, (meth)acrylonitrile, vinyl acetate, maleic anhydride, N-substituted maleimide, or mixtures thereof. However, more particularly useful monomers are represented by the following Structures (III) through (VII):

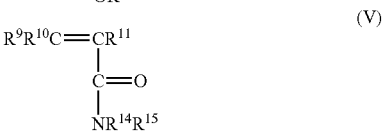

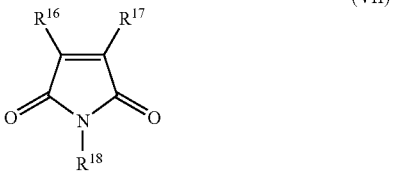

wherein $R^9$ and $R^{10}$ are independently hydrogen, substituted or unsubstituted alkyl groups having 1 to 6 carbon atoms, substituted or unsubstituted alkenyl groups having 1 to 6 carbon atoms, substituted or unsubstituted aryl groups (including aromatic carbocyclic and heterocyclic groups), halo groups, substituted or unsubstituted alkoxy groups having 1 to 6 carbon atoms, substituted or unsubstituted acyl groups having 1 to 6 carbon atoms, substituted or unsubstituted acyloxy groups having 1 to 6 carbon atoms, or $R^9$ and $R^{10}$ together can form a cyclic group, such as a cyclopentyl or cyclohexyl group or form one of the following divalent groups:

—$NHC(O)CH_2CH_2CH_2$—, —$NHC(O)CH_2CH_2$—, —$CH_2C(O)OC(O)$—, —$(CH_2)_2C(O)OC(O)$—, and —$CH_2C(O)OC(O)CH_2$—. $R^9$ and $R^{10}$ are preferably hydrogen or methyl.

$R^{11}$ is hydrogen or a substituted or unsubstituted alkyl group having 1 to 6 carbon atoms, substituted or unsubstituted aryl group (including aromatic carbocyclic and heterocyclic groups), or halo group. $R^{11}$ is preferably hydrogen or methyl.

$R^{12}$ is hydrogen or a substituted or unsubstituted alkyl group having 1 to 6 carbon atoms, substituted or unsubstituted aryl group (both aromatic carbocyclic or heterocyclic groups), cyano group, or halo group. $R^{12}$ is preferably a substituted or unsubstituted phenyl group (that is, to provide a styrenic monomer).

$R^{13}$ is hydrogen or a substituted or unsubstituted alkyl group having 1 to 20 carbon atoms, substituted or unsubstituted alkenyl group having 1 to 20 carbon atoms, substituted or unsubstituted cycloalkyl group, substituted or unsubstituted cycloalkenyl group, substituted or unsubstituted aryl group (including aromatic carbocyclic and heterocyclic groups), or substituted or unsubstituted alkoxyalkylene group having 1 to 20 carbon atoms. $R^{13}$ is preferably methyl, ethyl, or hydroxyethyl.

$R^{14}$ and $R^{15}$ are independently hydrogen or substituted or unsubstituted alkyl groups having 1 to 20 carbon atoms, substituted or unsubstituted alkenyl groups having 1 to 20 carbon atoms, substituted or unsubstituted cycloalkyl groups, substituted or unsubstituted cycloalkenyl groups, substituted or unsubstituted aryl groups (including aromatic carbocyclic and heterocyclic groups), or substituted or unsubstituted alkoxyalkylene groups having 1 to 12 carbon atoms. $R^{14}$ and $R^{15}$ are preferably independently hydrogen or methyl.

$R^{16}$ and $R^{17}$ are independently hydrogen or substituted or unsubstituted alkyl groups having 1 to 6 carbon atoms, substituted or unsubstituted alkenyl groups having 1 to 6 carbon atoms, substituted or unsubstituted aryl groups (including carbocyclic and heterocyclic groups), halo groups, cyano groups, substituted or unsubstituted alkoxy groups having 1 to 6 carbon atoms, substituted or unsubstituted acyl groups having 1 to 6 carbon atoms, or substituted or unsubstituted acyloxy groups having 1 to 6 carbon atoms. $R^{16}$ and $R^{17}$ are independently preferably hydrogen, methyl, or phenyl.

$R^{18}$ is hydrogen or a substituted or unsubstituted alkyl group having 1 to 7 carbon atoms (including a benzyl group), substituted or unsubstituted aryl group (including aromatic carbocyclic and heterocyclic groups), or hydroxy group. $R^{18}$ is generally hydrogen or a substituted or unsubstituted phenyl group.

Preferably, the recurring units represented by B are derived from styrene, N-phenylmaleimide, (meth)acrylic acid, (meth)acrylonitrile, 2-hydroxyethyl methacrylate, or methyl methacrylate, or mixtures of two or more of these monomers.

The polymeric binder is present in the radiation-sensitive composition in an amount sufficient to render the radiation-sensitive composition soluble or dispersible in an aqueous developer. Generally, this amount is from about 10 to about 90 weight %, preferably from about 20 to about 70 weight % and more preferably from 30 to 60 weight %.

The polymeric binders useful in this invention are solids and generally have a glass transition ($T_g$) temperature of from about 35 to about 220° C., preferably from about 45 to about 180° C., and more preferably from about 50 to about 130° C., as measured using conventional procedures.

In addition, the polymeric binders generally have a number average molecular weight ($M_n$) of from about 1,000 to about 1,000,000 and preferably from about 5,000 to about 100,000.

The polymeric binders containing a carbazole derivative can be prepared using conventional radical polymerization conditions and known starting materials. More details about such polymerization methods are provided by Belfield et al. (Eds.), *Photoinitiated Polymerization. ASC Symposium Series* 847, American Chemical Society, Washington, D.C., 2003, pp. 219–230. Representative polymerization methods are shown below prior to the Examples.

In addition to the polymeric binders described above, the radiation-sensitive composition may also include one or more "co-binders" that do not contain carbazole moieties. However, when such co-binders are present, they comprise less than 50% based on the total polymeric binder weight. Useful co-binders include but are not limited to, cellulosic polymers, poly(vinyl alcohols), polymers derived from (meth)acrylic acid, poly(vinyl pyrrolidones), polymers of meth(acrylates), polyesters, polyacetals, and mixtures thereof. Such co-binders can also provide crosslinkable sites.

The radiation-sensitive composition may further include a poly(alkylene glycol) or an ether or ester thereof that has a molecular weight of from about 200 and up to 4000 (preferably from about 500 to about 2000). This compound may be present in an amount of from about 2 to about 50 weight % (preferably from about 5 to about 30%) based on the total solids content of the composition, or the total dry weight of the imageable layer. Particularly useful compounds of this type include, but are not limited to, one or more of polyethylene glycol, polypropylene glycol, polyethylene glycol methyl ether, polyethylene glycol dimethyl ether, polyethylene glycol monoethyl ether, polyethylene glycol diacrylate, ethoxylated bisphenol A di(meth)acrylate, and polyethylene glycol mono methacrylate. Also useful are SR9036 (ethoxylated (30)bisphenol A dimethacrylate), CD9038 (ethoxylated (30)bisphenol A diacrylate), and SR494 (ethoxylated (5)pentaerythritol tetraacrylate), and similar compounds all of which that can be obtained from Sartomer Company, Inc.

Other materials that may be present in the radiation-sensitive composition include a styrene-acrylonitrile-poly (ethylene oxide) graft copolymer, colorants, viscosity builders, surfactants, dispersing agents, humectants, biocides, plasticizers, pH adjusters, drying agents, defoamers, preservatives, antioxidants, development aids, rheology modifiers or combinations thereof, or any other addenda commonly used in the lithographic art, in conventional amounts. Useful viscosity builders include hydroxypropyl cellulose, hydroxyethyl cellulose, carboxymethyl cellulose, and poly (vinyl pyrrolidones).

The radiation-sensitive composition may also include a mercaptan derivative such as a mercaptotriazole such as 3-mercapto-1,2,4-triazole, 4-methyl-3-mercapto-1,2,4-triazole, 5-mercapto-1-phenyl-1,2,4-triazole, 4-amino-3-mercapto-1,2,4,-triazole, 3-mercapto-1,5-diphenyl-1,2,4-triazole, and 5-(p-aminophenyl)-3-mercapto-1,2,4-triazole. Various mercaptobenzimidazoles, mercaptobenzthiazoles, and mercaptobenzoxazoles may also be present.

Imageable Elements

The imageable elements are formed by suitable application of a radiation-sensitive composition as described above to a suitable substrate. This substrate is usually treated or coated in various ways as described below prior to application of the radiation-sensitive composition. Preferably, there is only a single imageable layer comprising the radiation-sensitive composition of this invention. If the substrate has been treated to provide an "interlayer" for improved adhesion or hydrophilicity, the applied radiation-sensitive composition is considered the "top" layer.

The substrate generally has a hydrophilic surface, or at least a surface that is more hydrophilic than the applied radiation-sensitive composition on the imaging side. The substrate comprises a support that can be composed of any material that is conventionally used to prepare imageable elements such as lithographic printing plates. It is usually in the form of a sheet, film, or foil, and is strong, stable, and flexible and resistant to dimensional change under conditions of use so that color records will register a full-color image. Typically, the support can be any self-supporting material including polymeric films (such as polyester, polyethylene, polycarbonate, cellulose ester polymer, and polystyrene films), glass, ceramics, metal sheets or foils, or stiff papers (including resin-coated and metallized papers), or a lamination of any of these materials (such as a lamination of an aluminum foil onto a polyester film). Metal supports include sheets or foils of aluminum, copper, zinc, titanium, and alloys thereof.

Polymeric film supports may be modified on one or both surfaces with a "subbing" layer to enhance hydrophilicity, or paper supports may be similarly coated to enhance planarity. Examples of subbing layer materials include but are not limited to, alkoxysilanes, aminopropyltriethoxysilanes, glycidioxypropyltriethoxysilanes, and epoxy functional polymers, as well as conventional hydrophilic subbing materials used in silver halide photographic films (such as gelatin and other naturally occurring and synthetic hydrophilic colloids and vinyl polymers including vinylidene chloride copolymers).

A preferred substrate is composed of an aluminum support that may be treated using techniques known in the art, including physical graining, electrochemical graining, chemical graining, and anodizing. Preferably, the aluminum sheet is anodized using phosphoric acid or sulfuric acid and conventional procedures.

An interlayer may be formed by treatment of the aluminum support with, for example, a silicate, dextrine, calcium zirconium fluoride, hexafluorosilicic acid, phosphate/fluoride, poly(vinyl phosphonic acid) (PVPA), vinyl phosphonic acid copolymer, poly(acrylic acid), or acrylic acid copolymer. Preferably, the aluminum support is treated with poly(acrylic acid) using known procedures to improve surface hydrophilicity.

Particularly useful imageable elements have substrates that are phosphoric acid anodized, poly(acrylic acid)-treated aluminum substrates or sulfuric acid anodized, sodium phosphate/sodium fluoride-treated aluminum substrates.

The thickness of the substrate can be varied but should be sufficient to sustain the wear from printing and thin enough to wrap around a printing form. Preferred embodiments include a treated aluminum foil having a thickness of from about 100 to about 600 μm.

The backside (non-imaging side) of the substrate may be coated with antistatic agents and/or slipping layers or a matte layer to improve handling and "feel" of the imageable element.

The substrate can also be a cylindrical surface having the radiation-sensitive composition applied thereon, and thus be an integral part of the printing press. The use of such imaged cylinders is described for example in U.S. Pat. No. 5,713,287 (Gelbart).

The radiation-sensitive composition can be applied to the substrate as a solution or dispersion in a coating liquid using any suitable equipment and procedure, such as spin coating, knife coating, gravure coating, die coating, slot coating, bar coating, wire rod coating, roller coating, or extrusion hopper coating. The composition can also be applied by spraying onto a suitable support (such as an on-press printing cylinder).

Illustrative of such methods is mixing the polymeric binder and other components of the radiation-sensitive composition in a suitable organic solvent [such as methyl ethyl ketone (2-butanone), methanol, ethanol, iso-propyl alcohol, acetone, n-propanol, and others readily known in the art, as well as mixtures thereof], dispersing the resulting solution in an aqueous medium, applying the resulting dispersion on a substrate, and removing the solvent(s) by evaporation under suitable drying conditions. After proper drying, the coating weight of the imageable layer is generally from about 0.1 to about 5 $g/m^2$, preferably from about 0.5 to about 3.5 $g/m^2$, and more preferably from about 0.5 to about 1.5 $g/m^2$.

The imageable element may further comprise an oxygen-impermeable overcoat layer that may serve as an oxygen barrier by comprising an oxygen-impermeable compound, that is, a compound that prevents the diffusion of oxygen from the atmosphere into the imageable layer during the lifetime of the free radicals generated by radiation exposure. The overcoat can also serve as a barrier to moisture. The overcoat layer is disposed on the imageable layer and should be soluble, dispersible, or at least permeable to the developer. The overcoat layer can also be designed to prevent physical or chemical damage to the imageable element from handling, transportation, or overexposure. Further details of such overcoat layers are provided in WO 99/06890 (Pappas et al.).

Underlayers can also be present under the imageable layer to enhance developability or to act as a thermal insulating layer. The underlying layer should be soluble or at least dispersible in the developer and preferably have a relatively low thermal conductivity coefficient.

The imageable elements have any useful form including, but not limited to, printing plate precursors, printing cylinders, printing sleeves and printing tapes (including flexible printing webs). Preferably, the imageable members are printing plate precursors.

Printing plate precursors can be of any useful size and shape (for example, square or rectangular) having the requisite imageable layer disposed on a suitable substrate. Printing cylinders and sleeves are known as rotary printing members having the substrate and imageable layer in a cylindrical form. Hollow or solid metal cores can be used as substrates for printing sleeves.

Imaging Conditions

During use, the imageable element is exposed to a suitable source of radiation such as UV, visible light, or infrared radiation, depending upon the sensitivity of the radiation-sensitive composition, at a wavelength of from about 150 to about 1500 nm. As noted above, in some embodiments, imaging is carried out using an infrared laser at a wavelength of from about 700 to about 1200 nm, and in other embodiments, imaging is carried out in the UV or visible regions of the electromagnetic spectrum, that is from about 150 to about 700 nm. The lasers used to expose the imaging member of this invention are preferably diode lasers, because of the reliability and low maintenance of diode laser systems, but other lasers such as gas or solid-state lasers may also be used. The combination of power, intensity and exposure time for laser imaging would be readily apparent to one skilled in the art.

The imaging apparatus can function solely as a platesetter or it can be incorporated directly into a lithographic printing press. In the latter case, printing may commence immediately after imaging, thereby reducing press set-up time considerably. The imaging apparatus can be configured as a flatbed recorder or as a drum recorder, with the imageable member mounted to the interior or exterior cylindrical surface of the drum. Examples of useful imaging apparatus are available as models of Creo Trendsetter® imagesetters available from Creo, a subsidiary of Eastman Kodak Company (Burnaby, British Columbia, Canada) that contain laser diodes that emit near infrared radiation at a wavelength of about 830 nm. Other suitable imaging sources include the Crescent 42T Platesetter that operates at a wavelength of 1064 nm and the Screen PlateRite 4300 series or 8600 series platesetter (available from Screen, Chicago, Ill.). Additional useful sources of radiation include direct imaging presses that can be used to image an element while it is attached to the printing plate cylinder. An example of a suitable direct imaging printing press includes the Heidelberg SM74-DI press (available from Heidelberg, Dayton, Ohio).

Useful "violet" laser imaging apparatus include the Prosetter platesetter from Heidelberger Druckmaschinene (Heidelburg, Germany), Mako 8 CTP platesetter from ECRM Imaging Systems (Tewksbury, Mass.), Polaris platesetter from Agfa Graphics (Mortsel, Belgium), LaserStar Jet CTP platesetter from Krause CTP Ltd. (Milford, Conn.), PlateRite 2044Vi platesetter from Screen Media Technology (Rolling Meadows, Ill.), and Saber Luxel Vx-9600 CTP platesetter from Fuji Photo (Valhalla, N.Y.).

Imaging speeds using infrared radiation imaging may be in the range of from about 20 to about 1500 mJ/cm$^2$, and more particularly from about 75 to about 400 mJ/cm$^2$. For imaging using ultraviolet/visible radiation, the imaging speeds may be from about 10 to about 200 µJ/cm$^2$.

While laser imaging is preferred in the practice of this invention, imaging can be provided by any other means that provides thermal energy in an imagewise fashion. For example, imaging can be accomplished using a thermoresistive head (thermal printing head) in what is known as "thermal printing", described for example in U.S. Pat. No. 5,488,025 (Martin et al.). Thermal print heads are commercially available for example, as a Fujitsu Thermal Head FTP-040 MCS001 and TDK Thermal Head F415 HH7-1089.

The imaged elements can be developed using conventional processing conditions and a conventional aqueous alkaline developer. The aqueous developer composition is dependent upon the nature of the polymeric binder, but common components include surfactants, chelating agents (such as salts of ethylenediaminetetraacetic acid), organic solvents (such as benzyl alcohol), and alkaline components (such as inorganic metasilicates, organic metasilicates, hydroxides, and bicarbonates). The pH of the aqueous developer is preferably from about 5 to about 14.

Aqueous alkaline developers generally have a pH of at least 7 and preferably of at least 11. The higher pH developers are generally best for processing the single-layer elements. Useful alkaline aqueous developers include 3000 Developer, 9000 Developer, GOLDSTAR Developer, GREENSTAR Developer, ThermalPro Developer, PROTHERM Developer, MX1813 Developer, and MX1710 Developer (all available from Kodak Polychrome Graphics, a subsidiary of Eastman Kodak Company). These compositions also generally include surfactants, chelating agents (such as salts of ethylenediaminetetraacetic acid), and alkaline components (such as inorganic metasilicates, organic metasilicates, hydroxides, and bicarbonates).

Solvent-based alkaline developers are generally single-phase solutions of one or more organic solvents that are miscible with water. Useful organic solvents include the reaction products of phenol with ethylene oxide and propylene oxide [such as ethylene glycol phenyl ether (phenoxyethanol)], benzyl alcohol, esters of ethylene glycol and of propylene glycol with acids having 6 or less carbon atoms, and ethers of ethylene glycol, diethylene glycol, and of propylene glycol with alkyl groups having 6 or less carbon atoms, such as 2-ethylethanol and 2-butoxyethanol. The organic solvent(s) is generally present in an amount of from about 0.5 to about 15% based on total developer weight.

Representative solvent-based alkaline developers include ND-1 Developer, 955 Developer, Developer 980, and 956 Developer (available from Kodak Polychrome Graphics a subsidiary of Eastman Kodak Company).

Developers T-190-4 and T-190-11 may be preferred for radiation-sensitive compositions that are imaged using "violet" light. These developers can be obtained from Kodak Polychrome Graphics, a subsidiary of Eastman Kodak Company.

Generally, the alkaline developer is applied to the imaged element by rubbing or wiping the outer layer with an applicator containing the developer. Alternatively, the imaged element can be brushed with the developer or the developer may be applied by spraying the outer layer with sufficient force to remove the exposed regions. Still again, the imaged element can be immersed in the developer. In all instances, a developed image is produced in a lithographic printing plate having excellent resistance to press room chemicals.

Following development, the imaged element can be rinsed with water and dried in a suitable fashion. The dried element can also be treated with a conventional gumming solution (preferably gum arabic). In addition, a postbake operation can be carried out.

Printing can be carried out by applying a lithographic ink and fountain solution to the printing surface of the imaged element. The fountain solution is taken up by the non-imaged regions on the surface of the hydrophilic substrate revealed by the imaging and development steps, and the ink is taken up by the imaged (non-removed) regions on the imaged layer. The ink is then transferred to a suitable receiving material (such as cloth, paper, metal, glass, or plastic) to provide a desired impression of the image thereon. If desired, an intermediate "blanket" roller can be used to transfer the ink from the imaged member to the receiving material. The imaged members can be cleaned between impressions, if desired, using conventional cleaning means.

The following examples are provided to illustrate the practice of the invention but are by no means intended to limit the invention in any manner.

EXAMPLES

The components and materials used in the examples and analytical were as follows:

Polymer H is a copolymer derived from 13 mol % methacrylic acid and 87 mol % methyl methacrylate.

Oligomer A is a urethane acrylate prepared by reacting Desmodur® N 100 with hydroxyethyl acrylate and pentaerythritol triacrylate (80 wt. % in MEK).

Oligomer B is a urethane acrylate prepared by reacting 2 parts of hexamethylene diisocyanate with 2 parts of hydroxyethyl methacrylate and 1 part of 2-(2-hydroxyethyl) piperidine.

PMI is N-phenylmaleimide.

Kayamer PM-2 is a mixture of mono- and di-esters of phosphoric acid with 2-hydroxyethyl methacrylate and was obtained from Nippon Kayaku (Tokyo, Japan).

NK Ester BPE-500 is 2,2-bis[4-(methacryloxypolyethoxy)-phenylpropane that was obtained from Shin-Nakamura Chemical Co. (Wakayama City, Japan).

Initiator A is 4-methylphenyl-4'-isobutylphenyl iodonium tetraphenylborate that was obtained from Ciba Specialty Chemicals.

o-Cl—HABI is 2,2-bis-(-2-chlorophenyl)-4,4',5,5'-tetraphenyl-biimidazole that was obtained from Hampford Research Inc. (Stratford, Conn.).

IRT is an IR dye available from Showa Denko, Tokyo, Japan.

IR Dye 1 has the following structure:

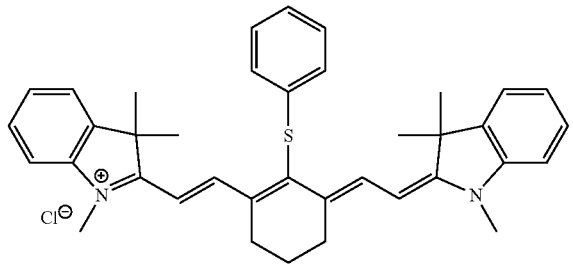

UV Dye 2 was obtained from Clariant (Frankfort, Germany) and has the following structure:

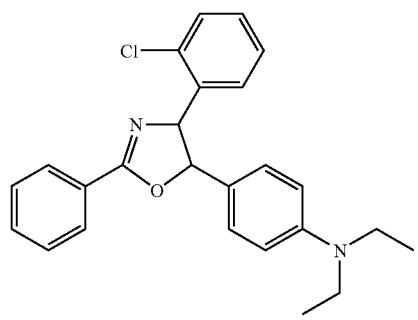

Pigment A (951) is a 27% solids dispersion of 7.7 parts of a polyvinyl acetal derived from polyvinyl alcohol acetalized with acetaldehyde, butyraldehyde and 4-formylbenzoic acid, 76.9 parts of Irgalith Blue GLVO (Cu-phthalocyanaine C.I. Pigment Blue 15:4), and 15.4 parts of Disperbyk® 167 dispersing aid (from Byk Chemie) in 1-methoxy-2-propanol.

Byk® 307 is a dispersion of polyethoxylated dimethylpolysiloxane co-polymer (Byk Chemie, Wallingford, Conn., USA).

956 Developer is an alkaline developer that is commercially available from Kodak Polychrome Graphics (Norwalk, Conn.), a subsidiary of Eastman Kodak Company.

ND-1 developer is an alkaline developer that is commercially available from Kodak Polychrome Graphics, Japan, a subsidiary of Eastman Kodak Company.

T190-4 developer is an alkaline developer that is commercially available from Kodak Polychrome Graphics (Norwalk, Conn.), a subsidiary of Eastman Kodak Company.

T190-11 developer is an alkaline developer that is commercially available from Kodak Polychrome Graphics, Inc. (Norwalk, Conn.).

PGME is 1-methoxy-2-propanol.

MEK is methyl ethyl ketone.

BLO is γ-butyrolactone.

The following polymeric binders were prepared and used in the Examples below:

Synthesis of Polymer A (Invention):

Azobis(isobutyronitrile) (AIBN, 0.4 g), methyl methacrylate (5 g), acrylonitrile (9 g), N-vinyl carbazole (5 g), methacrylic acid (2 g), and N,N-dimethylacetamide (80 g) were placed in a 500-ml 3-necked flask, equipped with magnetic stirring, temperature controller, and $N_2$ inlet. The mixture was heated to 60° C. and stirred under $N_2$ protection overnight (~16 hours) to provide about 20% solids. The reaction mixture was then slowly dropped into 3 liters of ice water while stirring. The resulting precipitate was filtered and washed with 250 ml of n-propanol, and dried in an oven at 50° C. for 3 hours to provide 18.4 g of white solid.

Synthesis of Polymer B (Invention):

AIBN (0.4 g), methyl methacrylate (4 g), acrylonitrile (9 g), N-vinyl carbazole (5 g), methacrylic acid (2 g), and N,N-dimethylacetamide (80 g) were placed in a 500-ml 3-necked flask, equipped with magnetic stirring, temperature controller and $N_2$ inlet. The mixture was heated to 60° C. and stirred under $N_2$ protection overnight (~16 hours) to provide about 20% solids. The reaction mixture was then slowly dropped into 3 liters of ice water while stirring. The resulting precipitate was filtered and washed with 250 ml of n-propanol, and dried in an oven at 50° C. for 3 hours to provide 18.0 g of white solid.

Synthesis of Polymer C (Comparative):

AIBN (0.4 g), methyl methacrylate (4 g), acrylonitrile (9 g), PMI (5 g), methacrylic acid (2 g), and N,N-dimethylacetamide (80 g) were placed in a 500-ml 3-necked flask, equipped with magnetic stirring, temperature controller, and $N_2$ inlet. The mixture was heated to 60° C. and stirred under $N_2$ protection overnight (~16 hours) to provide 18.6% solids. The reaction mixture was then slowly dropped into 3 liters of ice water while stirring. The resulting precipitate was filtered and washed with 250 ml of n-propanol, and dried in an oven at 50° C. for 3 hours to provide 15.5 g of white solid.

Synthesis of Polymer D (Comparative):

AIBN (0.4 g), methyl methacrylate (4 g), acrylonitrile (9 g), styrene (4 g), methacrylic acid (2 g), and N,N-dimethylacetamide (80 g) were placed in a 500-ml 3-necked flask, equipped with magnetic stirring, temperature controller, and $N_2$ inlet. The mixture was heated to 60° C. and stirred under $N_2$ protection overnight (~16 hours) to provide 19.3% solids. The reaction mixture was then slowly dropped into 3 liters of ice water while stirring. The resulting precipitate was filtered and washed with 250 ml of n-propanol, and dried in an oven at 50° C. for 3 hours to provide 18.5 g of white solid.

Synthesis of Polymer E (Comparative):

AIBN (0.4 g), methyl methacrylate (9 g), acrylonitrile (9 g), methacrylic acid (2 g), and N,N-dimethylacetamide (80 g) were placed in a 500-ml 3-necked flask, equipped with magnetic stirring, temperature controller, and $N_2$ inlet. The mixture was heated to 60° C. and stirred under $N_2$ protection overnight (~16 hours) to provide 19.2% solids. The reaction mixture was then slowly dropped into 3 liters of ice water while stirring. The resulting precipitate was filtered and washed with 250 ml of n-propanol, and dried in an oven at 50° C. for 3 hours to provide 17.0 g of white solid.

Synthesis of Polymer F (Invention):

AIBN (0.4 g), methyl methacrylate (2 g), N-vinyl carbazole (7 g), acrylonitrile (9 g), methacrylic acid (2 g), and N,N-dimethylacetamide (80 g) were placed in a 500-ml 3-necked flask, equipped with magnetic stirring, temperature controller, and $N_2$ inlet. The mixture was heated to 60° C. and stirred under $N_2$ protection overnight (~16 hours) to provide about 20% solids. The reaction mixture was then slowly dropped into 3 liters of ice water while stirring. The resulting precipitate was filtered and washed with 250 ml of n-propanol, and dried in an oven at 50° C. for 3 hours to provide 19.0 g of white solid.

Synthesis of Polymer G (Invention):

AIBN (0.4 g), 2-hydroxyethyl methacrylate (2 g), acrylonitrile (7 g), styrene (4 g), N-vinyl carbazole (5 g), methacrylic acid (2 g), and N,N-dimethylacetamide (80 g) were placed in a 500-ml 3-necked flask, equipped with magnetic stirring, temperature controller, and $N_2$ inlet. The mixture was heated to 60° C. and stirred under $N_2$ protection overnight (~16 hours) to provide about 20% solids. The reaction mixture was then slowly dropped into 3 liters of ice water while stirring. The resulting precipitate was filtered and washed with 250 ml of n-propanol, and dried in an oven at 50° C. for 3 hours to provide 17.7 g of white solid.

Invention Examples 1–4 and Comparative Examples 1–3

IR-sensitive imageable layer coating formulations were prepared by dissolving 0.98 g of Invention polymers A, B, F, and G (for Examples 1–4, respectively) or Comparative polymers C, D, and E (Comparative Examples 1–3, respectively), Oligomer A (0.91 g), Initiator A (0.22 g), IRT (0.09 g), 3-mercaptotriazole (0.05 g), Pigment A (0.30 g), polyethylene glycol methyl ether (0.54 g, MW=750, Aldrich), and 10% Byk® 307 (0.27 g) in PGME (25.8 g), MEK (16.2 g), and BLO (4.7 g). A mechanically-grained and phosphoric acid anodized aluminum substrate that had been post-treated with poly(acrylic acid) was coated with each coating formulation to provide a dry coating weight of about 1.3 g/m² in the imageable layer when properly dried at 170° F. (77° C.) for about 2 minutes on a rotating drum.

The resulting imageable elements of Invention Examples 1–4 and Comparative Examples 1–3 were imaged on a CREO Trendsetter 3244x image setter (Creo, a subsidiary of Eastman Kodak Company, Burnaby, British Columbia, Canada) using an 830 nm IR laser in the range from 40 to 210 mJ/cm². Each imaged element was then developed using an Anitec Duplex 16 processor charged with ND-1 developer at 25° C. to provide imaged printing plates.

The optical densities of the resulting images as a function of exposure energy are shown in FIG. 1. The results show that use of the carbazole-containing Polymers A, B, F, and G in Examples 1–4 provided higher optical density in the image area than use of the Comparative Polymers C, D, and E in Comparative Example 1–3, suggesting that the polymerization efficiency was improved with use of the carbazole-containing polymers according to the present invention.

Invention Example 5

An IR-sensitive imageable layer coating formulation (composition of the present invention) was prepared by dissolving Polymer A (2.5 g), Oligomer A (2.34 g), Initiator A (0.57 g), IRT (0.21 g), 3-mercaptotriazole (0.13 g), Pigment A (0.76 g), polyethylene glycol methyl ether (1.36 g, MW=750, Aldrich), and 10% Byk® 307 (0.69 g) in PGME (45.9 g), MEK (40.9 g), and BLO (4.7 g). A mechanically-grained and phosphoric acid anodized aluminum substrate that had been post-treated with poly(acrylic acid) was coated with the coating formulation to provide an imageable layer having a dry coating weight of about 1.3 g/m² when properly dried at 170° F. (77° C.) for about 2 minutes on a rotating drum.

The resulting imageable element was placed on a CREO Trendsetter 3244x imagesetter and exposed to an 830 nm IR laser at about 120 mJ/cm². The imaged element was then developed using an Anitec Duplex 16 processor charged with ND-1 developer at 25° C. The resulting imaged printing plate was mounted on a Miehle sheet-fed press using ink containing 1.5% calcium carbonate to produce at least 10,000 good impressions.

Invention Example 6

An IR-sensitive imageable layer coating formulation (composition of the present invention) was prepared by dissolving Polymer B (2.71 g), Oligomer A (3.21 g), Sartomer 355 (0.54 g, ditrimethylolpropane tetraacrylate, Sartomer Co., Inc.), 2-(4-methoxyphenyl)-4,6-bis(trichloromethyl)-2-triazine (0.32 g), N-phenyliminodiacetic acid (0.17 g), IR Dye 1 (0.11 g), crystal violet (0.08 g), and 10% Byk® 307 (0.14 g) in PGME (50.4 g), MEK (36.7 g), and BLO (4.7 g). An electrochemically grained and anodized aluminum substrate, post-treated with sodium phosphate/sodium fluoride, was coated with coating formulation to provide an imageable layer having a dry coating weight of about 1.2 g/m² when properly dried at 170° F. (77° C.) for about 2 minutes on a rotating drum.

An overcoat formulation was prepared by mixing 9.7% Airvol 203 (67.9 g, polyvinyl alcohol), 20% poly(vinyl imidazole) (5.83 g), 2-propanol (20.7 g), and deionized water (405.6 g). After applying the overcoat formulation over the imageable layer, the element was dried at 170° F. (77° C.) for about 1 minute on a rotating drum to yield a dry coating weight about 0.5 g/m².

The resulting imageable element was placed on a CREO Trendsetter 3244x imagesetter and exposed to an 830 nm IR laser in the range of from 20 to 120 mJ/cm². The imaged element was then developed by hand with diluted 956 Developer at 25° C. The minimum exposure energy to achieve maximum processed density was about 40 mJ/cm². This image printing plate passed a 5-day keeping test at 50° C., but it lost the image during a 5-day keeping test at 38° C. and 80% humidity.

Invention Example 7 and Comparative Example 4

UV-sensitive imageable layer formulations were prepared with the components shown in TABLE I:

TABLE 1

| | Inventive Example 7 (parts by weight) | Comparative Example 4 (parts by weight) |
|---|---|---|
| Polymer A | 1.50 | — |
| Polymer H | — | 1.50 |
| NK Ester BPE 500 | 0.50 | 0.50 |
| Oligomer B | 2.73 | 2.74 |
| Kayamer PM-2 | 0.07 | 0.07 |
| UV Dye 2 | 0.93 | 0.93 |
| o-Cl-HABI | 0.23 | 0.23 |
| 3-Mercaptotriazole | 0.41 | 0.41 |
| Pigment A | 0.93 | 0.94 |
| Byk ® 307 | 0.01 | 0.01 |
| 1-Methoxy-2-propanol | 36.26 | 64.67 |
| 2-Butanone | 20.55 | 20.54 |
| Ethyl acetate | 7.47 | 7.47 |
| N,N-Dimethylacetamide | 28.43 | — |

The imageable layer formulations were coated and dried to provide an imageable layer coverage of 1.6 g/m² on an electrochemically grained and sulfuric-acid-anodized aluminum. The substrate for Invention Example 7 was post-treated with a sodium phosphate/sodium fluoride while the substrate for Comparative Example 4 was post-treated with poly(vinyl phosphonic acid).

A 1.9 g/m² oxygen barrier layer was provided by applying a 5% solution of poly(vinyl pyrrolidone)/poly(vinyl alcohol) over the imageable layer. The resulting imageable elements were imaged at a series of exposures on a conventional Luxel Vx-9600 violet platesetter and processed (bypassing the entry heater) using a Glunz & Jensen Raptor 85 Polymer processor charged with Kodak Polychrome Graphics T190-11 developer at 25° C.

Uniform image densities were obtained for exposures ranging from 5 to 160 μJ/cm² for the Invention Example 7 element. Uniform image densities for the element of Comparative Example 4 were only obtained at exposures greater than 100 μJ/cm².

Invention Example 8

A UV-sensitive imageable layer formulation (composition of the present invention) and imageable element were prepared as described in Invention Example 7 except that the amount of Polymer A was increased to 2.14 parts by weight. The imageable element was imaged at 19 μJ/cm² using a Luxel Vx-9600 violet platesetter and was hand-processed using the T190-4 developer. The imaged printing plate was mounted on a Komori Sprint 26 press and used to print 10,000 impressions with an abrasive ink containing 1.5% calcium carbonate without showing a loss of print density in the solid image areas.

The invention has been described in detail with particular reference to certain preferred embodiments thereof, but it will be understood that variations and modifications can be effected within the spirit and scope of the invention.

The invention claimed is:

1. A radiation-sensitive composition comprising:
    a radically polymerizable component,
    an initiator composition capable of generating radicals sufficient to initiate polymerization of said radically polymerizable component upon exposure to imaging radiation,
    a sensitizing dye, and
    a polymeric binder comprising a polymer backbone and having attached thereto a carbazole derivative represented by the following Structure (I):

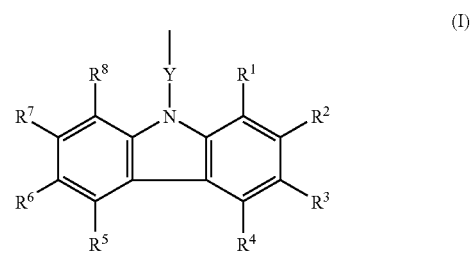

(I)

wherein Y is a direct bond or a linking group, and $R^1$ to $R^8$ are independently hydrogen, or an alkyl, alkenyl, aryl, halo, cyano, alkoxy, acyl, acyloxy, or carboxylate groups, or any adjacent $R^1$ through $R^8$ groups can together form a carbocyclic or heterocyclic group or a fused aromatic ring.

2. The composition of claim 1 wherein Y is a direct bond, and $R^1$ to $R^8$ are independently hydrogen or alkyl groups having 1 to 8 carbon atoms or halo groups.

3. The composition of claim 2 wherein each of $R^1$ to $R^8$ is hydrogen.

4. The composition of claim 1 wherein said sensitizing dye has a $\lambda_{max}$ of from about 650 to about 1500 nm.

5. The composition of claim 1 wherein said sensitizing dye has a $\lambda_{max}$ of from about 150 to about 650 nm.

6. The composition of claim 5 wherein said sensitizing dye is represented by the Structure $G\text{-}(Ar_1)_3$ or $Ar_1\text{-}G\text{-}Ar_2$ wherein $Ar_1$ and $Ar_2$ are the same or different, substituted or unsubstituted carbocyclic aryl group, and G is a furan, oxazole, or oxadiazole ring, or $Ar_2$ can also be an arylene-$G\text{-}Ar_1$ or arylene-$G\text{-}Ar_2$ group.

7. The composition of claim 6 wherein said sensitizing dye has Structure $G\text{-}(Ar_1)_3$ wherein each of said $Ar_1$ is substituted with a primary, secondary, or tertiary amine.

8. The composition of claim 1 wherein said radically polymerizable component comprises comprises an ethylenically unsaturated polymerizable group or a crosslinkable ethylenically unsaturated group.

9. The composition of claim 1 wherein said initiator composition comprises a triazine compound, peroxide, 2,4,5-triarylimidazolyl dimer, an onium salt, oxime ether or ester, N-phenyl glycine or derivative thereof, anilinodiacetic acid or derivative thereof, thiol compound, or combinations thereof of two or more of these compounds.

10. The composition of claim 1 wherein said initiator composition comprises an organic boron salt, iodonium, sulfonium, an s-triazine, or a combination of two or more of these compounds.

11. The composition of claim 1 wherein said initiator composition is present in an amount of from about 0.5 to about 30%, said radically polymerizable component is present in an amount of from about 10 to about 70%, said sensitizer is present in an amount of from about 1 to about 20%, said polymeric binder is present in an amount of from about 10 to about 90%, all percentages based on composition total solids.

12. The composition of claim 1 wherein said polymeric binder has a number average molecular weight of from about 1,000 to about 1,000,000 and an acid value of from about 5 to about 400 mg KOH/g, and is represented by the following Structure (II):

(II)

wherein A represents recurring units comprising the carbazole derivative represented by Structure (I), B represents recurring units derived from ethylenically unsaturated polymerizable monomers that do not comprise a carbazole derivative, x is from about 0.1 to about 99.9 mol %, and y is from about 0.1 to about 99.9 mol % based on total recurring units.

13. The composition of claim 12 wherein B represents recurring units derived from one or more (meth)acrylamides, (meth)acrylates, (meth)acrylonitrile, (meth)acrylic acid, styrenic monomer, N-substituted maleimides, vinyl acetate, maleic anhydride, or 2-hydroxyethyl methacrylate, x is from about 5 to about 50 mol %, and y is from about 50 to about 95 mol %, and said polymeric binder has a number average molecular weight of from about 5,000 to about 100,000 and an acid number of from about 10 to about 200 mg KOH/g.

14. A negative-working imageable element comprising a substrate having thereon an imageable layer comprising:
   a radically polymerizable component,
   an initiator composition capable of generating radicals sufficient to initiate polymerization of said radically polymerizable component upon exposure to imaging radiation,
   a sensitizing dye, and
   a polymeric binder comprising a polymer backbone and having attached thereto a carbazole derivative represented by the following Structure (I):

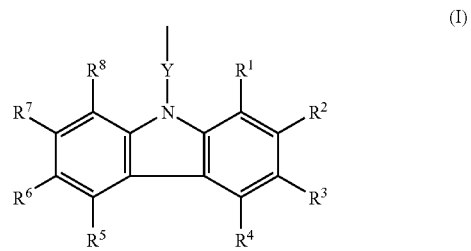
(I)

wherein Y is a direct bond or a linking group, and $R^1$ to $R^8$ are independently hydrogen, or an alkyl, alkenyl, aryl, halo, cyano, alkoxy, acyl, acyloxy, or carboxylate groups, or any adjacent $R^1$ through $R^8$ groups can together form a carbocyclic or heterocyclic group or a fused aromatic ring.

15. The element of claim 14 wherein said substrate is a phosphoric acid anodized, poly(acrylic acid)-treated aluminum substrate or a sulfuric acid anodized, phosphate/fluoride-treated aluminum substrate.

16. The element of claim 14 wherein said sensitizing dye has a $\lambda_{max}$ of from about 750 to about 1200 nm, said radically polymerizable component comprises comprises an ethylenically unsaturated polymerizable group or a crosslinkable ethylenically unsaturated group and said initiator composition comprises an iodonium borate salt, sulfonium, or s-triazine, or a combination of two or more these compounds.

17. The element of claim 14 wherein said sensitizing dye has a $\lambda_{max}$ of from about 150 to about 750 nm, said radically polymerizable component comprises an ethylenically unsaturated polymerizable group or a crosslinkable ethylenically unsaturated group and said initiator composition comprises a triazine compound, peroxide, 2,4,5-triarylimidazolyl dimer, an onium salt, oxime ether or ester, N-phenyl glycine or derivative thereof, anilinodiacetic acid or derivative thereof, thiol compound, or a combination of two or more these compounds.

18. The element of claim 14 wherein said initiator composition is present in an amount of from about 0.5 to about 30%, said radically polymerizable component is present in an amount of from about 10 to about 70%, said sensitizer is present in an amount of from about 1 to about 20%, said polymeric binder is present in an amount of from about 10 to about 90%, all percentages based on dry imageable layer weight.

19. The element of claim 14 wherein said polymeric binder has a number average molecular weight of from about 1,000 to about 1,000,000 and an acid value of from about 5 to about 400 mg KOH/g, and is represented by the following Structure (II):

(II)

wherein A represents recurring units comprising the carbazole derivative represented by Structure (I), B represents recurring units derived from ethylenically unsaturated polymerizable monomers that do not comprise a carbazole derivative, x is from about 0.1 to about 99.9 mol %, and y is from about 0.1 to about 99.9 mol %, based on total recurring units.

20. The element of claim 19 wherein B represents recurring units derived from one or more (meth)acrylamides, (meth)acrylates, (meth)acrylonitrile, (meth)acrylic acid, styrenic monomer, N-substituted maleimides, vinyl acetate, maleic anhydride, or 2-hydroxyethyl methacrylate, x is from about 5 to about 50 mol %, and y is from about 50 to about 95 mol %, and said polymeric binder has a number average molecular weight of from about 5,000 to about 100,000 and an acid number of from about 10 to about 200 mg KOH/g.

21. The element of claim 14 wherein said initiator composition comprises an iodonium borate salt when said sensitizer has a $\lambda_{max}$ of from about 750 to about 900 nm or a hexaarylbisimidazole when said sensitizer has a $\lambda_{max}$ of from about 150 to about 650 nm, said radically polymerizable component is derived from the reaction of a multifunctional isocyanate compound and one or more urea urethane or urethane (meth)acrylates comprising carboxy groups, and said polymeric binder comprises recurring units derived from N-vinyl carbazole.

22. A method of making a negative-working printing plate comprising:
   A) imagewise exposing an imageable element comprising a substrate having thereon an imageable layer comprising:
      a radically polymerizable component,
      an initiator composition capable of generating radicals sufficient to initiate polymerization of said radically polymerizable component upon exposure to imaging radiation,
      a sensitizing dye, and
      a polymeric binder comprising a polymer backbone and having attached thereto a carbazole derivative represented by the following Structure (I):

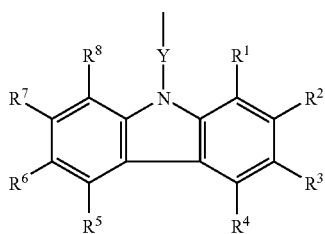
(I)

wherein Y is a direct bond or a linking group, and $R^1$ to $R^8$ are independently hydrogen, or an alkyl, alkenyl, aryl, halo, cyano, alkoxy, acyl, acyloxy, or carboxylate group, or any adjacent $R^1$ through $R^8$ groups can together form a carbocyclic or heterocyclic group or a fused aromatic ring, to form both imaged and non-imaged regions in said imageable layer, B) developing said imagewise exposed imageable layer to remove only said non-imaged regions, and C) optionally baking said imagewise exposed element after step A.

23. The method of claim 22 wherein said imagewise exposing step A is carried out using radiation having a maximum wavelength of from about 700 to about 1200 nm.

24. The method of claim 22 wherein said imagewise exposing step A is carried out using radiation having a maximum wavelength of from about 150 to about 700 nm, and said imageable element optionally including an oxygen-impermeable overcoat disposed over said imageable layer.

25. An imaged element obtained from the method of claim 22.

* * * * *